(12) United States Patent
Saeki et al.

(10) Patent No.: US 12,015,094 B2
(45) Date of Patent: Jun. 18, 2024

(54) SEALING MATERIAL SHEET FOR SOLAR-CELL MODULE AND SOLAR-CELL MODULE USING THE SAME

(71) Applicant: DAI NIPPON PRINTING CO., LTD., Tokyo (JP)

(72) Inventors: Kosuke Saeki, Tokyo (JP); Shinya Yoneda, Tokyo (JP); Jun Tanaka, Tokyo (JP); Hiroaki Tamaki, Tokyo (JP); Shinsuke Nagino, Tokyo (JP); Naohiro Obonai, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/958,948

(22) Filed: Oct. 3, 2022

(65) Prior Publication Data
US 2023/0099082 A1 Mar. 30, 2023

Related U.S. Application Data

(63) Continuation of application No. 16/381,478, filed on Apr. 11, 2019, now abandoned.

(51) Int. Cl.
*H01L 31/044* (2014.01)
*B32B 27/08* (2006.01)
(Continued)

(52) U.S. Cl.
CPC .......... *H01L 31/0481* (2013.01); *B32B 27/08* (2013.01); *B32B 27/32* (2013.01);
(Continued)

(58) Field of Classification Search
CPC .................. H01L 31/00–078; Y02E 10/50–60
(Continued)

(56) References Cited

U.S. PATENT DOCUMENTS

2013/0174907 A1 7/2013 Murasawa et al.
2013/0247987 A1 9/2013 Taniguchi et al.
(Continued)

FOREIGN PATENT DOCUMENTS

JP  2009-010277 A  1/2009
JP  2013-258164 A  12/2013
(Continued)

OTHER PUBLICATIONS

JP2018050026 English (Year: 2018).*
JP-2015204385-A English (Year: 2015).*

*Primary Examiner* — Bach T Dinh
(74) *Attorney, Agent, or Firm* — Oliff PLC

(57) ABSTRACT

To provide a sealing material sheet for a solar-cell module that has high productivity without performing crosslinking processing, and has a high tensile shear adhesion force at normal temperature at a high level in addition to heat resistance and molding characteristics. A sealing material sheet is a multi-layer sheet using a polyethylene-based resin as a base resin, a core layer has a density of 0.880 g/cm³ to 0.895 g/cm³ and a melting point of 70° C. or higher, a skin layer has a density of 0.880 g/cm³ to 0.910 g/cm³ and a melting point of 90° C. or lower and contains a silane-modified polyethylene-based resin, a weight average molecular weight of the silane-modified polyethylene-based resin contained in the skin layer 11 in terms of polystyrene is 70000 to 120000, and a polymerized silane amount of the skin layer in the whole resin component is 300 ppm to 2000 ppm.

14 Claims, 5 Drawing Sheets

(51) Int. Cl.
*B32B 27/32* (2006.01)
*B32B 37/15* (2006.01)
*H01L 31/048* (2014.01)
*H01L 31/049* (2014.01)

(52) U.S. Cl.
CPC ........ *B32B 37/153* (2013.01); *H01L 31/0488* (2013.01); *H01L 31/049* (2014.12); *B32B 2307/72* (2013.01); *B32B 2457/12* (2013.01)

(58) Field of Classification Search
USPC ................................................ 136/243–265
See application file for complete search history.

(56) References Cited

U.S. PATENT DOCUMENTS

| | | |
|---|---|---|
| 2014/0014178 A1 | 1/2014 | Muguruma |
| 2014/0311557 A1 | 10/2014 | Matsui et al. |

FOREIGN PATENT DOCUMENTS

| | | | |
|---|---|---|---|
| JP | 2015070071 A | | 4/2015 |
| JP | 2015204385 A | * | 11/2015 |
| JP | 2018050026 A | | 3/2018 |
| JP | 2018-060838 A | | 4/2018 |
| WO | 2012/073971 A1 | | 6/2012 |
| WO | 2016121990 A1 | | 8/2016 |
| WO | 2018047422 A1 | | 3/2018 |

* cited by examiner

SEALING MATERIAL SHEET FOR SOLAR-CELL MODULE AND SOLAR-CELL MODULE USING THE SAME

CROSS-REFERENCE TO RELATED APPLICATION

This is a Continuation of application Ser. No. 16/381,478 filed Apr. 11, 2019. The disclosure of the prior application is hereby incorporated by reference herein in its entirety.

BACKGROUND OF THE INVENTION

Field of the Invention

The present invention relates to a sealing material sheet for a solar-cell module and a solar-cell module using the same. Specifically, the present invention relates particularly to a sealing material sheet that can be preferably used in a double-sided glass protecting substrate type solar-cell module and a double-sided glass protecting substrate type solar-cell module using the same.

Related Art

Recently, as awareness of the environmental problems rises to a higher level, solar cells are in the spotlight as clean energy sources. Currently, solar-cell modules that are constituted in various types are developed and suggested. There are various layer constitutions in solar-cell modules, but as a constitution that is particularly excellent in barrier property for preventing intrusion of moisture into a module, long-term durability in harsh use conditions, and the like, a solar-cell module having a constitution in which both a front-surface protecting substrate and a rear-surface protecting substrate are configured by a protecting substrate made of glass is also devised (see Patent Document 1). Incidentally, in the present specification, the solar-cell module having a constitution in which protecting substrates disposed on both outermost surfaces of a module main body are configured by a glass substrate in this way is referred to as a "double-sided glass protecting substrate type solar-cell module."

Conventionally, as a sealing material sheet used in a solar-cell module, also including a double-sided glass protecting substrate type solar-cell module, from the viewpoints of processability, workability, manufacturing cost, and the like, an ethylene-vinyl acetate copolymer resin (EVA) has been mainly used. However, the EVA resin tends to slowly decompose as it is used for a long period of time, and thus, there is a possibility of generating acetic acid gas affecting a solar cell element. For these reasons, in recent years, a demand for a sealing material sheet for a solar-cell module using a polyethylene-based resin instead of the EVA resin has been increasing (see Patent Document 2).

In general, transparency and flexibility of the sealing material sheet for a solar-cell module using a polyethylene-based resin as a base resin can be improved by decreasing the density thereof. However, on the other hand, a decrease in density causes problems such as insufficient heat resistance. In this regard, in the sealing material sheet of Patent Document 2, the heat resistance is imparted by a crosslinking agent. In this case, the heat resistance is reliably improved. However, when a crosslinking treatment is performed to an extent that is sufficient and necessary for providing sufficient heat resistance to be endurable for a long-time use under a high temperature, a problem arises in that followability (hereinafter, referred to as "molding characteristics") to irregularities on a surface of a facing member cannot be maintained, at the time of modularization. Further, in manufacturing processing necessarily including a crosslinking treatment, film formation ability decreases as the crosslinking progresses during molding. Therefore, it is required to carry out molding at a low temperature and to carry out crosslinking reaction again after molding, and it is required to further improve productivity.

For example, as a sealing material sheet that is intended to achieve both heat resistance and molding characteristics without undergoing a crosslinking treatment, there is disclosed a sealing material sheet that is intended to achieve both heat resistance and molding characteristics without performing the crosslinking treatment by being configured as a multi-layer sheet obtained by combining a skin layer, which is obtained by mixing two or more kinds of resins each having a different melting point, and a core layer formed from a sealing material composition added with a nucleating agent such as inorganic particles (see Patent Document 3).

Patent Document 1: Japanese Unexamined Patent Application, Publication No. 2013-9258164
Patent Document 2: Japanese Unexamined Patent Application, Publication No. 2009-10277
Patent Document 3: PCT International Publication No. WO2012/073971

SUMMARY OF THE INVENTION

The double-sided glass protecting substrate type solar-cell module that has been widely used in recent years has a frameless structure in which a metallic frame surrounding a module side surface is excluded, in many cases (see Patent Document 1). In this case, in addition to achieving of both the heat resistance and the molding characteristics mentioned above, a high tensile shear adhesion force (an adhesion force according to JIS K 6850 Adhesives-Determination of tensile lap-shear strength of rigid-to-rigid bonded assemblies) at normal temperature is required in the sealing material sheet in terms of the structure of the solar-cell module. There is no sealing material sheet, which meets three requirements of the heat resistance, the molding characteristics, and further a high tensile shear adhesion force at normal temperature at a high level, yet.

The present invention was made in view of the above circumstances. An object of the present invention is to provide a sealing material sheet for a solar-cell module that is a sealing material sheet using a polyethylene-based resin, has high productivity without performing crosslinking processing, and has a high tensile shear adhesion force at normal temperature at a high level in addition to heat resistance and molding characteristics.

The inventors of the present invention conducted a thorough investigation, and as a result, the inventors found that the above-described problems can be solved by a sealing material sheet being configured as a multi-layer sheet having a constitution of a skin layer—a core layer—a skin layer, a predetermined amount range of a silane-modified polyethylene-based resin being contained in the skin layer while a melting point of the core layer is maintained to 70° C. or higher, and this silane-modified polyethylene-based resin being specified to be in a specific high molecular weight range. Thus, the inventors finally completed the present invention. More specifically, the present invention provides the following.

(1) A sealing material sheet for a solar-cell module, the sealing material sheet being a multi-layer sheet using a polyethylene-based resin as a base resin and including a core layer and a skin layer disposed on both outermost surfaces, in which the core layer has a density of 0.880 g/cm$^3$ to 0.930 g/cm$^3$ and a melting point of 70° C. or higher, the skin layer has a density of 0.880 g/cm$^3$ to 0.900 g/cm$^3$ and a melting point of 90° C. or lower, and the skin layer contains a silane-modified polyethylene-based resin, a weight average molecular weight of the silane-modified polyethylene-based resin contained in the skin layer in terms of polystyrene being 70000 to 120000, a polymerized silane amount of the skin layer in the whole resin component being 300 ppm to 2000 ppm.

(2) The sealing material sheet described in the above (1), in which the weight average molecular weight of the silane-modified polyethylene-based resin contained in the skin layer in terms of polystyrene is 90000 to 120000.

(3) The sealing material sheet described in the above (1) or (2), in which melting points of the core layer and the skin layer are both 70° C. to 80° C.

(4) A solar-cell module obtained by sequentially laminating a transparent front substrate, a sealing material of a light receiving surface side, a solar cell element, a sealing material of a non-light receiving surface side, and a rear-surface protecting substrate, the sealing material of the light receiving surface side and the sealing material of the non-light receiving surface side being the sealing material sheet according to any one of the above (1) to (3).

(5) The solar-cell module described in the above (4), in which both the transparent front substrate and the rear-surface protecting substrate are a protecting substrate made of glass.

(6) The solar-cell module described in the above (5), in which the solar-cell module is a frameless module having no protecting frame that surrounds a circumference of a side surface of a module laminate interposed between the protecting substrates made of glass to maintain a shape of the module laminate.

(7) The solar-cell module described in any one of the above (4) to (6), in which, in a surface of the solar cell element, convex portions formed by a part of the surface protruding in a line-shaped manner or a dot-shaped manner exist, the convex portions being buried inside the sealing material sheet laminated on the surface, and a thickness of the convex portion is 50% to 90% of a thickness of the sealing material sheet laminated on the surface of the solar cell element.

According to the present invention, it is possible to provide a sealing material sheet for a solar-cell module that is a sealing material sheet using a polyethylene-based resin, has high productivity without performing crosslinking processing, and has a high tensile shear adhesion force at normal temperature at a high level in addition to heat resistance and molding characteristics.

DETAILED DESCRIPTION OF THE INVENTION

Figure 1:
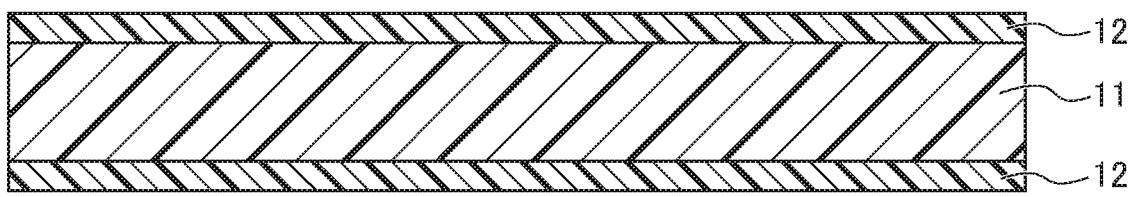
FIG. 1 is a cross-sectional view schematically illustrating a layer constitution of a sealing material sheet of the present invention.

Hereinafter, a sealing material composition that can be used in manufacturing of a sealing material sheet for a solar-cell module of the present invention, a sealing material sheet for a solar-cell module of the present invention, and a solar-cell module using the sealing material sheet of the present invention will be sequentially described.

Sealing Material Composition

The sealing material sheet of the present invention can be manufactured by melt molding a sealing material composition that will be hereinafter described in detail. The sealing material composition is separated for each layer into a sealing material composition for a core layer and a sealing material composition for a skin layer. Further, when a multi-layer sheet having a three-layer constitution that includes a core layer as an inner layer and a skin layer as an outermost surface layer is formed by those respective sealing material compositions for a core layer and a skin layer, the sealing material sheet of the present invention typified, for example, by the sealing material sheet 1 illustrated in FIG. 1 can be manufactured. Incidentally, in the present specification, the skin layer refers to a layer that is disposed at both outermost surface sides of the multi-layer sealing material sheet. Further, the core layer refers to an inner layer other than the skin layer in the multi-layer sealing material sheet. In the sealing material sheet of the present invention, the core layer itself may further have a multi-layer inner constitution, but the sealing material sheet 1 having a three-layer constitution in which a skin layer is laminated on both surfaces of the core layer having a single layer constitution is a typical embodiment of the present invention. Hereinafter, an embodiment of the present invention will be described with a focus on this sealing material sheet 1.

Sealing Material Composition for Core Layer

The sealing material composition for a core layer is a thermoplastic sealing material composition that uses a polyethylene-based resin as a base resin, does not contain a crosslinking agent, and does not need crosslinking processing at the time of molding a sealing material sheet. Further, the sealing material composition for a core layer may contain an appropriate amount of other resins such as a silane-modified polyethylene-based resin and other components, other than a low-density polyethylene-based resin (LDPE) or the like as a base resin, in a range that does not impair the effect of the present invention.

As the base resin of the sealing material composition for a core layer, a low-density polyethylene-based resin (LDPE), a linear low-density polyethylene-based resin (LL-DPE), or a metallocene-based linear low-density polyethylene-based resin (M-LLDPE) can be preferably used. Of them, from the viewpoint of long-term reliability of the solar-cell module, a low-density polyethylene-based resin (LDPE) can be particularly preferably used as the sealing material composition for a core layer. Incidentally, the "base resin" in the present specification refers to a resin having the largest content ratio in the resin component of the resin composition, in the resin composition containing the base resin.

It is preferable that the sealing material composition for a core layer further contains a predetermined amount of a silane-modified polyethylene-based resin in addition to the above-described base resin. In the sealing material composition for a core layer, the silane-modified polyethylene-based resin is not necessarily an essential component, but in a case where a silane-modified polyethylene-based resin is contained in the sealing material composition for a core layer, it is preferable that the silane-modified polyethylene-based resin is a silane-modified polyethylene-based resin having a weight average molecular weight in terms of polystyrene of 70000 or more (hereinafter, this is also referred to as a "high molecular weight type silane-modified polyethylene-based resin").

Regarding the amount of the high molecular weight type silane-modified resin added to the sealing material composition for a core layer, it is preferable that the high molecular weight type silane-modified resin is contained in the sealing material composition for a core layer at such a proportion that the polymerized silane amount of a core layer 11 in the whole resin component becomes 30 ppm to 2000 ppm. When an appropriate amount of such a high molecular weight type silane-modified polyethylene-based resin is contained in the sealing material composition for a core layer, this can contribute to improvement in high tensile shear adhesion force of the sealing material sheet 1 at normal temperature. Incidentally, regarding the polymerized silane amount in each layer of the sealing material, the abundance in the resin component can be specified, for example, by quantitating elements in each layer by ICP emission analysis or the like. Details of the high molecular type silane-modified resin that can be used in the sealing material sheet 1 will be described later.

The density of the sealing material composition for a core layer is 0.880 g/cm$^3$ to 0.930 g/cm$^3$, preferably 0.880 g/cm$^3$ to 0.920 g/cm$^3$, and more preferably 0.885 g/cm$^3$ to 0.895 g/cm$^3$. When the density of the sealing material composition for a core layer is set in the above-described range, the heat resistance and the molding characteristics can be provided to the sealing material sheet 1 at a good balance without undergoing the crosslinking treatment.

The melting point of the sealing material composition for a core layer may be 70° C. to 110° C. and is preferably 73° C. to 90° C. As long as the melting point of the core layer 11 of the sealing material sheet 1 can be maintained in the above-described range, polyethylene-based resins each having a different melting point can be appropriately mixed to obtain a sealing material composition for a core layer. For example, according to a resin composition obtained by mixing three kinds of polyethylene-based resins respectively having melting points of 60° C., 90° C., and 97° C. in each amount of 65 parts by mass, 8 parts by mass, and 32 parts by mass, the melting point of the whole core layer can be set to 74° C., and a blending example of such material resins can be exemplified as a preferable resin blending example of the sealing material composition for a core layer.

Herein, the melting point in the present specification refers to an average of each intrinsic melting point of each component contained in a measurement target product and melting points obtained by calculation from the blending ratio of these components.

For example, the melting point of the sealing material sheet or each resin layer constituting the sealing material sheet according to the above-described definition can be measured by differential scanning calorimetry (DSC). In a case where there are a plurality of peaks of a valley in the DSC curve, the melting point shown by a peak having the largest peak area among the peaks can be regarded as the melting point of the sealing material sheet or each resin layer described above.

Further, as another method of specifying the melting point from the sealing material sheet according to the above-described definition, there is mentioned a method of measuring a linear expansion peak temperature that is a temperature in the largest value at which a linear expansion coefficient shifts from increase to decrease in a case where a measurement linear expansion coefficient measured according to JIS K 7179 is represented as a function of a resin temperature. According to this method, the melting point according to the above-described definition can be approximately specified from a completed product such as a sealing material sheet in a variation range within roughly about 2° C.

When the melting point of the sealing material composition for a core layer is maintained to 70° C. or higher as described above, heat resistance necessary for the sealing material sheet 1 can be imparted. Further, in a relation with heating conditions at the time of melt molding for forming a sheet as the sealing material sheet and at the time of a thermal lamination treatment for integration as the solar-cell module, the melting point of the sealing material composition for a core layer may be generally about 110° C. or lower, and in order to sufficiently enhance the molding characteristics of the sealing material sheet 1, the melting point of the sealing material composition for a core layer is more preferably 90° C. or lower.

The melt mass flow rate (MFR) of the sealing material composition for a core layer may be 3.0 g/10 min or more and less than 5.0 g/10 min, and as long as the MFR is in this range, a polyethylene-based resin having an MFR of 0.8 g/10 min or more and less than 5.0 g/10 min can be appropriately mixed and used. When the MFR of the sealing material composition for a core layer is set in the above-described range, the heat resistance and the molding characteristics can be provided to the sealing material sheet 1 at a good balance.

Incidentally, the MFR in the present specification is a value obtained by the following method unless otherwise particularly specified. MFR (g/10 min): measured according to JIS K 7210. Specifically, a synthetic resin was heated and pressurized at 190° C. in a cylindrical vessel heated by a heater, and the amount of the resin extruded per 10 minutes from an opening (nozzle) provided at the bottom of the vessel was measured. An extrusion plastometer was used as a testing machine and the extrusion load was 2.16 kg. Incidentally, regarding the MFR of the multi-layer sealing material sheet, a measurement value obtained by performing the measurement by the above-described treatment while the whole layers are in a multi-layer state of being integrally laminated is used as the MFR value of the multi-layer sealing material sheet.

Sealing Material Composition for Skin Layer

The sealing material composition for a skin layer is also a thermoplastic sealing material composition that uses a polyethylene-based resin as a base resin and does not contain a crosslinking agent, similarly to the sealing material composition for a core layer. Further, the point that an appropriate amount of other components may be contained in a range that does not impair the effect of the present invention is the same as in the sealing material composition for a core layer. However, the sealing material composition for a skin layer is different from the sealing material composition for a core layer in that it is essential to contain a specific amount of a silane-modified polyethylene-based resin having a weight average molecular weight in terms of polystyrene of 70000 or more (high molecular weight type silane-modified polyethylene-based resin).

As the base resin of the sealing material composition for a skin layer, similarly to the sealing material composition for a core layer, a low-density polyethylene-based resin (LDPE), a linear low-density polyethylene-based resin (LL-DPE), or a metallocene-based linear low-density polyethylene-based resin (M-LLDPE) can be preferably used. Of them, from the viewpoint of molding characteristics, a metallocene-based linear low-density polyethylene-based resin (M-LLDPE) can be particularly preferably used as a composition for the skin layer.

The sealing material composition for a skin layer used in the sealing material sheet 1 further contains a predetermined amount of a silane-modified polyethylene-based resin as an essential resin component in addition to the above-described base resin. Further, the silane-modified polyethylene-based resin contained in the composition for the skin layer is limited to a silane-modified polyethylene-based resin having a weight average molecular weight in terms of polystyrene of 70000 or more (hereinafter, also referred to as "high molecular weight type silane-modified polyethylene-based resin").

Further, this high molecular weight type silane-modified resin is contained in the sealing material composition for a skin layer at such a proportion that the polymerized silane amount in the whole resin component of the skin layer becomes 300 ppm to 2000 ppm. When an appropriate amount of such a high molecular weight type silane-modified polyethylene-based resin is contained in the sealing material composition for a skin layer, extremely high tensile shear adhesion force at normal temperature can be imparted to the sealing material sheet 1. Details of the high molecular type silane-modified resin that can be used in the sealing material sheet 1 will be described later.

The density of the sealing material composition for a skin layer is 0.880 g/cm³ to 0.910 g/cm³ and more preferably 0.899 g/cm³ or less. When the density of the sealing material composition for a skin layer is set in the above-described range, the adhesion of the sealing material sheet 1 can be maintained in a preferable range.

The melting point of the sealing material composition for a skin layer may be 70° C. to 90° C. and is preferably 70° C. to 80° C. As long as the melting point of the skin layer can be maintained in the above-described range similarly to the core layer, polyethylene-based resins each having a different melting point can be appropriately mixed to obtain a sealing material composition for a skin layer. For example, according to a resin composition obtained by mixing three kinds of polyethylene-based resins respectively having melting points of 60° C., 90° C., and 97° C. in each amount of 65 parts by mass, 20 parts by mass, and 20 parts by mass, the melting point of the whole skin layer can be set to 73° C., and a blending example of such material resins can be exemplified as a preferable resin blending example of the sealing material composition for a skin layer. When the melting point of the sealing material composition for a skin layer is set to 70° C. or higher, heat resistance necessary for the sealing material sheet 1 can be imparted. Further, when the melting point of the sealing material composition for a skin layer is set to 90° C. or lower, the molding characteristics of the sealing material sheet at the time of being integrated as the solar-cell module can be maintained in a preferable range.

The melt mass flow rate (MFR) of the sealing material composition for a skin layer may be 3.0 g/10 min or more and less than 5.0 g/10 min, and as long as the MFR is in this range, a polyethylene-based resin having an MFR of 0.8 g/10 min or more and less than 5.0 g/10 min can be appropriately mixed and used. When the MFR of the sealing material composition for a skin layer is set in the above-described range, the heat resistance and the molding characteristics can be provided to the sealing material sheet 1 at a good balance.

Silane-Modified Polyethylene-Based Resin

Regarding the sealing material sheet 1, it is essential that a silane-modified polyethylene-based resin is contained in at least a skin layer 12, and further, the silane-modified polyethylene-based resin contained in the skin layer 12 is essentially a "high molecular weight type silane-modified polyethylene-based resin."

Hereinafter, first, a general "silane-modified polyethylene-based resin" will be described, and then details of the "high molecular weight type silane-modified polyethylene-based resin" that is an important constitution requisite of the invention of the present application will be described.

The silane-modified polyethylene-based resin is obtained by graft polymerization of an ethylenically unsaturated silane compound as a side chain using a linear low-density polyethylene-based resin (LLDPE) or the like as a main chain. Further, the "silane-modified polyethylene-based resin" in the present specification is a copolymer obtained by copolymerization using at least an α-olefin and an ethylenically unsaturated silane compound as comonomers and optionally other unsaturated monomer as a comonomer and includes a product of modification or condensation of such a copolymer.

Alternatively, a copolymer of an α-olefin and an ethylenically unsaturated silane compound or a product of modification or condensation of the copolymer can be produced, for example, by the following method. First, one or two or more α-olefins and optionally one or two or more unsaturated monomers are subjected to simultaneous or stepwise polymerization using a desirable reaction vessel in the presence of a radical polymerization initiator and optionally a chain transfer agent as described above. Then, the polyolefin-based polymer produced by the polymerization is subjected to graft copolymerization of one or two or more ethylenically unsaturated silane compounds. Then, further, silane compound moieties that constitute the graft copolymer produced by the copolymer are optionally modified or condensed. Through the above process, a copolymer of the α-olefin and the ethylenically unsaturated silane compound or a product of modification or condensation of the copolymer can be produced.

As the α-olefin, for example, one or more kinds selected from ethylene, propylene, 1-butene, isobutylene, 1-pentene, 2-methyl-1-butene, 3-methyl-1-butene, 1-hexene, 1-heptene, 1-octene, 1-nonene, and 1-decene can be used.

As the ethylenically unsaturated silane compound, for example, one or more kinds selected from vinyltrimethoxysilane, vinyltriethoxysilane, vinyltripropoxysilane, vinyltriisopropoxysilane, vinyltributoxysilane, vinyltripentyloxysilane, vinyltriphenoxysilane, vinyltribenzyloxysilane, vinyltrimethylenedioxysilane, vinyltriethylenedioxysilane, vinylpropionyloxysilane, vinyltriacetoxysilane, and vinyltricarboxysilane can be used.

As other unsaturated monomers, for example, one or more kinds selected from vinyl acetate, acrylic acid, methacrylic acid, methyl acrylate, methyl methacrylate, ethyl acrylate, and vinyl alcohol can be used.

Examples of the radical polymerization initiator that can be used include organic peroxides such as lauroyl peroxide, dipropionyl peroxide, benzoyl peroxide, di-tert-butyl peroxide, t-butyl hydroperoxide, and t-butyl peroxybutyrate, molecular oxygen, and azo compound such as azobisisobutyronitrile and azoisobutylvaleronitrile.

Examples of the chain transfer agent that can be used include paraffinic hydrocarbons such as methane, ethane, propane, butane, and pentane, α-olefins such as propylene, 1-butene, and 1-hexene, aldehydes such as formaldehyde, acetaldehyde, and n-butyl aldehyde, ketones such as acetone, methyl ethyl ketone, and cyclohexanone, aromatic hydrocarbons, and chlorinated hydrocarbons.

For example, a method for modification or condensation of silane compound moieties that constitute a random copolymer or a method for modification or condensation of silane compound moieties that constitute a graft copolymer may include a method of carrying out a dehydration condensation reaction between silanol groups of silane compound moieties that constitute a random copolymer or a graft copolymer with α-olefin and an ethylenically unsaturated silane compound using a silanol condensation catalyst such as a carboxylate of a metal such as tin, zinc, iron, lead, or cobalt, and an organometallic compound such as a titanate or a chelate compound, an organic base, an inorganic acid, or an organic acid so that a product of modification or condensation of the copolymer of an α-olefin and an ethylenically unsaturated silane compound is produced.

As the silane-modified polyethylene-based resin, any of a random copolymer, an alternating copolymer, a block copolymer, and a graft copolymer can be preferably used. However, the silane-modified polyethylene-based resin is more preferably a graft copolymer and even more preferably a graft copolymer having a polyethylene main chain for polymerization and an ethylenically unsaturated silane compound-derived side chain grafted to the main chain. Such a graft copolymer in which silanol groups contributable to adhesion force have a high degree of freedom can improve the adhesion of other member in the solar-cell module, particularly, the sealing material sheet to a glass substrate or the like.

The content of the ethylenically unsaturated silane compound when the silane-modified polyethylene-based resin is formed is, for example, about 0.001 to 15% by mass, preferably about 0.01 to 5% by mass, and particularly preferably about 0.05 to 2% by mass with respect to the total mass of the copolymer. In a case where the content of the ethylenically unsaturated silane compound that constitutes the copolymer of the α-olefin and the ethylenically unsaturated silane compound is in the above-described range, particularly, adhesion of the sealing material sheet with glass is significantly improved. When the content of the silane compound exceeds the above-described range, tensile elongation, heat sealability, and the like of the sealing material sheet tend to be degraded, which is not preferable.

In the sealing material sheet 1, of the silane-modified polyethylene-based resins described above, the "high molecular weight type silane-modified polyethylene-based resin" in a particular molecular weight range is used as a resin essentially added to the sealing material composition for a skin layer.

Regarding the molecular weight of the high molecular weight type silane-modified polyethylene-based resin used as a resin essentially added to the sealing material composition for a skin layer, the weight average molecular weight in terms of polystyrene is 70000 to 120000 and preferably 90000 to 120000. Incidentally, when the molecular weight of the silane-modified polyethylene-based resin exceeds 120000, compatibility with the base resin, which is assumed that the MFR is preferably about 3.0 g/10 min to 5.0 g/10 min deteriorates, which is not preferable.

The measurement of the molecular weight of each resin component that constitutes the sealing material sheet 1 can be performed using a conventionally known GPC method. Incidentally, since polyolefin is hardly dissolved in a solvent at normal temperature, it is preferable that the molecular weight is measured using a solvent such as trichlorobenzene or o-dichlorobenzene by GPC of a high temperature of 140 to 150° C. Particularly in the case of the sealing material sheet 1, in order to measure the molecular weight of the silane-modified polyethylene-based resin contained in the skin layer 12, the molecular weight of the silane-modified polyethylene-based resin can be specified by separating the skin layer of the sealing material sheet 1 that is a multi-layer sheet, combining the molecular weight measurement and component analysis by GPC-FTIR or the like, and reading the molecular weight corresponding to a component identified by IR. Incidentally, a number average molecular weight Mn, a weight average molecular weight Mw, and a degree of dispersion d in a case where a polymer having a molecular weight Mi (g/mol) is Ni (polymers) in the skin layer of the sealing material sheet 1 are defined by the following equations, respectively. Number average molecular weight $Mn=\Sigma(MiNi)/\Sigma Ni$ Weight average molecular weight $Mw=\Sigma(Mi^2Ni)/\Sigma MiNi$ Degree of dispersion $d=Mw/Mn$ Other Additive Components To the respective sealing material compositions for a core layer and a skin layer that constitute the sealing material sheet 1, particularly, the sealing material composition for a skin layer, an adhesion improver can be appropriately added. As the adhesion improver, a known silane coupling agent can be used, but a silane coupling agent having an epoxy group (hereinafter, also referred to as an "epoxy-based silane coupling agent") or a silane coupling agent having a mercapto group (hereinafter, also referred to as a "mercapto-based silane coupling agent") can be particularly preferably used.

Other components can be further contained in the respective sealing material compositions for a core layer and a skin layer. For example, components such as a weathering master batch for imparting weatherability to the sealing material sheet, various fillers, a light stabilizer, an ultraviolet ray absorbent, and a heat stabilizer can be exemplified. The contents of those components vary depending on the shapes, densities, and the like of particles thereof, but are preferably in a range of about 0.001% by mass to 5% by mass in the respective sealing material compositions. By including such additives, the stable mechanical strength, effect on preventing yellowing or cracks, and the like for a long period of time can be imparted to the sealing material sheet.

Sealing Material Sheet

The sealing material sheet of the present invention can be manufactured by melt molding the aforementioned sealing material composition.

As illustrated in FIG. 1, the sealing material sheet 1 includes the core layer 11 and the skin layer 12 is formed on both surfaces of the core layer 11. However, even in the case of a sealing material sheet in which a core layer has a multi-layer constitution and other functional layers are disposed in the core layer, as long as the sealing material sheet has the core layer and the skin layer that have the constitution requisites of the present invention, and other constitution requisites of the present invention, the sealing material sheet is within the scope of the present invention.

The MFR of the sealing material sheet 1 having the three-layer constitution including the core layer 11 and the skin layer 12 is 3.0 g/10 min or more and less than 5.0 g/10 min and preferably 3.3 g/10 min or more and less than 3.8 g/10 min in terms of average of the whole layer. When the MFR of the sealing material sheet 1 is less than 5.0 g/10 min, heat resistance necessary for the sealing material sheet 1 can be provided. Further, when the MFR thereof is 3.0 g/10 min or more, molding characteristics necessary for the sealing material sheet 1 can be provided.

The total thickness of the sealing material sheet 1 having the three-layer constitution including the core layer 11 and the skin layer 12 is preferably 250 μm to 600 μm and more preferably 300 μm to 550 μm. When the total thickness is less than 250 μm, impact cannot be sufficiently alleviated, but when the total thickness is 250 μm or more, for example, even in a case where the total thickness of the sealing material sheet 1 is decreased to about 250 μm, the sealing material sheet 1 can be formed to have both the molding characteristics and the heat resistance at a sufficiently preferable level. Incidentally, in a case where the total thickness exceeds 600 μm, the effect of further improving the impact alleviation effect is hardly obtainable, it is also not possible to respond to the demand for decreasing the thickness of the solar-cell module, and this is not economical, which is not preferable.

Further, the thickness of the core layer 11 in the sealing material sheet 1 is 200 μm to 400 μm and preferably 250 μm to 350 μm. Further, the thickness of each layer of the skin layer 12 is 30 μm to 100 μm and preferably 35 μm to 80 μm. Further, the total thickness of the two skin layers 12 laminated on both surfaces of the core layer is 1/20 to 1/3 and preferably 1/15 to 1/4 of the total thickness of the sealing material sheet 1. When the thickness of each layer of the sealing material sheet 1 is set in such a range, the heat resistance and the molding characteristics of the sealing material sheet 1 can be maintained in a favorable range.

The sealing material sheet 1 is formed by various molding methods generally used for molding a general thermoplastic resin, such as injection molding, extrusion molding, blow molding, compression molding, and rotational molding. As an example of the method for forming a sealing material sheet in a case where the sealing material sheet is a multi-layer film, there is a method for forming a sealing material sheet by coextrusion molding using three kinds of melt kneading/extruding machines.

However, in any methods described above, the melt molding temperature in manufacturing of the sealing material sheet 1 is preferably the melting point of the base resin of the sealing material composition for a core layer contained in the sealing material composition +30° C. or higher. Specifically, the melt molding temperature is preferably set to a high temperature from 175° C. to 230° C. and more preferably set to a high temperature in a region from 190° C. to 210° C. Since the sealing material composition used in the sealing material sheet 1 is a thermoplastic composition not containing a crosslinking agent, it is not necessary to consider the control of unfavorable crosslinking progression during melt molding. According to this, in manufacturing of the sealing material sheet using a polyethylene-based resin as a base resin, limitation on temperature in a case where a thermosetting sealing material composition essentially needing a crosslinking treatment that has been general in the related art is used does not need to be considered, and the melt molding temperature can be set to a higher temperature region in order to improve productivity. According to this, the sealing material sheet 1 can be manufactured with higher productivity that that of the thermosetting sealing material sheet in the related art.

Solar-Cell Module

The sealing material sheet 1 can be widely used in various solar-cell modules that are conventionally known. In general, in the solar-cell module, a sealing material is disposed in a mode of being interposed between both surfaces of the solar cell element and sealing the surfaces. On the other hand, the sealing material sheet 1 can also be disposed as a sealing material on both surfaces of the solar cell element or only a sealing material on any one of the surfaces can also be used in the sealing material sheet 1.

The sealing material sheet can be used in various solar-cell modules as described above, but can be particularly preferably used in a double-sided glass protecting substrate type solar-cell module having a laminated glass structure or a solar-cell module in which a convex portion having a relatively high height such as a lead wire is formed on a solar cell element, such as a thin film solar-cell module.

Double-Sided Glass Protecting Substrate Type Solar-Cell Module

Figure 2:
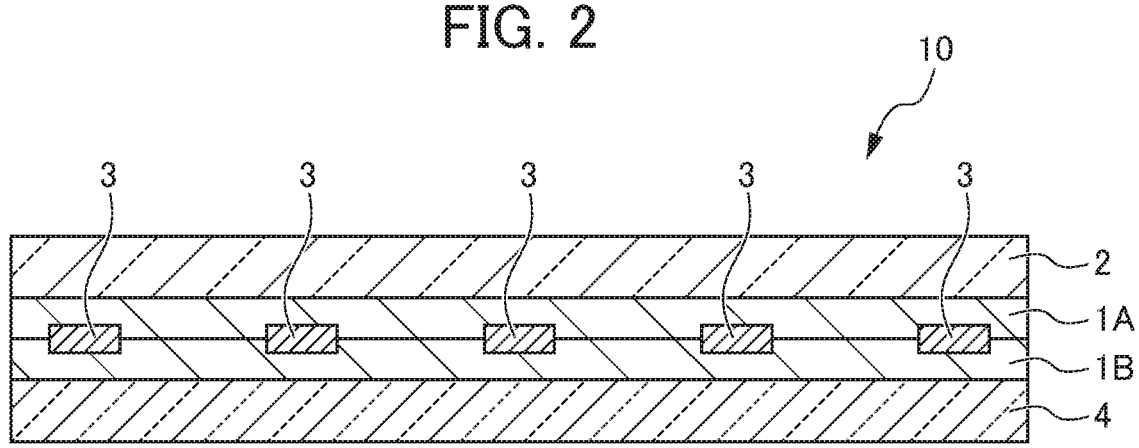
FIG. 2 is a cross-sectional view illustrating an example of a layer constitution of a double-sided glass protecting substrate type solar-cell module that is formed using the sealing material sheet of the present invention.

FIG. 2 is a cross-sectional view illustrating an example of a layer constitution of a double-sided glass protecting substrate type solar-cell module 10 that can be formed using the sealing material sheet 1 of the present invention. The solar-cell module 10 includes a transparent front substrate 2, a sealing material 1A of a light receiving surface side, a solar cell element 3, a sealing material 1B of a non-light receiving surface side, and a rear-surface protecting substrate 4 which are laminated in this order from a light receiving surface side of incident light, and the solar cell element 3 is sealed between the sealing material 1A of the light receiving surface side and the sealing material 1B of the non-light receiving surface side.

In the double-sided glass protecting substrate type solar-cell module 10, both the transparent front substrate 2 and the rear-surface protecting substrate 4 are a protecting substrate made of glass. As the protecting substrate made of glass, various glass plate materials that have been used as a translucent substrate material constituting the solar-cell module in the related art can be used without particular limitations. The solar-cell module 10 may include a member other than the above-described members.

Further, the solar cell element 3 is also not particularly limited. The solar cell element is not limited to a crystalline silicon solar cell produced using a monocrystalline silicon substrate or a polycrystalline silicon substrate, but a thin film solar cell (CIGS) obtained using amorphous silicon, microcrystalline silicon, a chalcopyrite-based compound, or the like can also be preferably used.

As the rear-surface protecting substrate 4, a resin sheet having a physical property typically required in a protecting layer, which is disposed on the outermost layer of the solar-cell module, such as water vapor barrier property or weathering resistance, can be used. Further, the rear-surface protecting substrate 4 may be a glass substrate similarly to the transparent front substrate 2. Since the sealing material sheet 1 has favorable adhesion even in any of a metal and glass, even in a case where the rear-surface protecting substrate 4 is a substrate made of glass, this rear-surface protecting substrate 4 can be preferably used.

In the solar-cell module having a general constitution in which the rear-surface protecting substrate is formed from a resin film having weathering resistance, in general, in order to maintain the shape of the laminate formed from each sheet-shaped member that constitutes the solar-cell module, a protecting frame made of metal or the like surrounding a circumference of a side surface of the laminate is provided. However, in the case of the double-sided glass protecting substrate type solar-cell module 10 formed by being interposed between protecting substrates made of glass, a so-called flameless structure solar-cell module in which such a protecting frame is excluded is also provided for decreasing the weight in many cases.

In the double-sided glass protecting substrate type solar-cell module 10 having a flameless structure, a high tensile shear adhesion force (an adhesion force according to JIS K 6850 Adhesives-Determination of tensile lap-shear strength of rigid-to-rigid bonded assemblies) at normal temperature is required in the sealing material. Since the sealing material sheet 1 of the present invention is regarded as a sealing material sheet having a particular tensile shear adhesion strength by specifying the molecular weight of the adhesion resin contained in the skin layer in a high range, the sealing material sheet 1 can be particularly preferably used in the double-sided glass protecting substrate type solar-cell module 10 having a flameless structure.

Thin Film Solar-Cell Module

Figure 3:
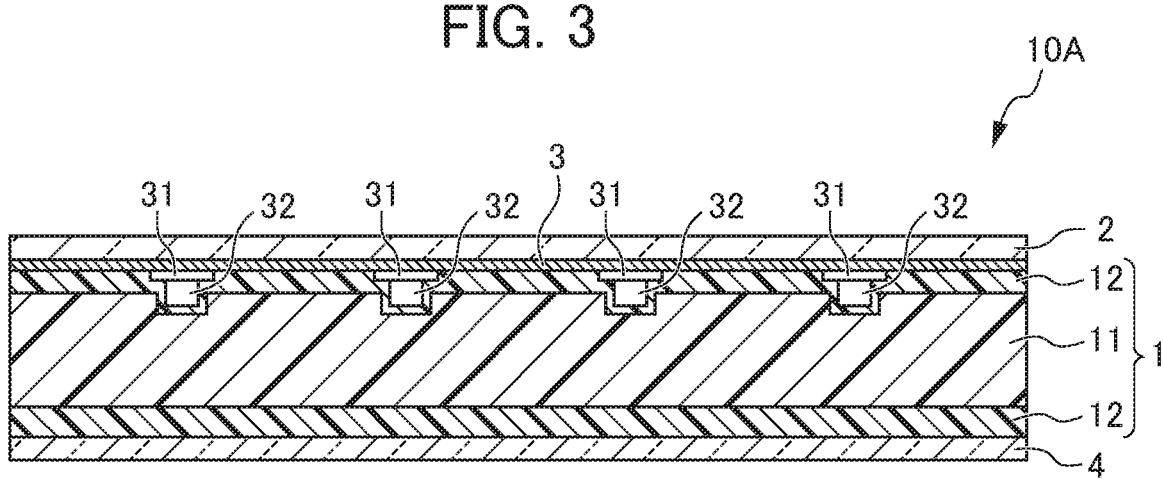
FIG. 3 is a sectional view schematically illustrating an example of a layer constitution of a solar-cell module that is formed using the sealing material sheet of the present invention and a thin film solar cell element.

FIG. 3 is a cross-sectional view illustrating an example of a layer constitution of a thin film solar-cell module 10A that can be formed using the sealing material sheet 1 of the present invention. The solar-cell module 10A includes a transparent front substrate 2, a thin film solar cell element 3 disposed on a surface of the transparent front substrate 2, a sealing material (the sealing material sheet 1), and a rear-surface protecting substrate 4 which are laminated in this order from a light receiving surface side of incident light. In the thin film solar-cell module 10A, the sealing material (the sealing material sheet 1) is laminated at a non-light receiving surface side of the solar cell element 3.

Figure 4:
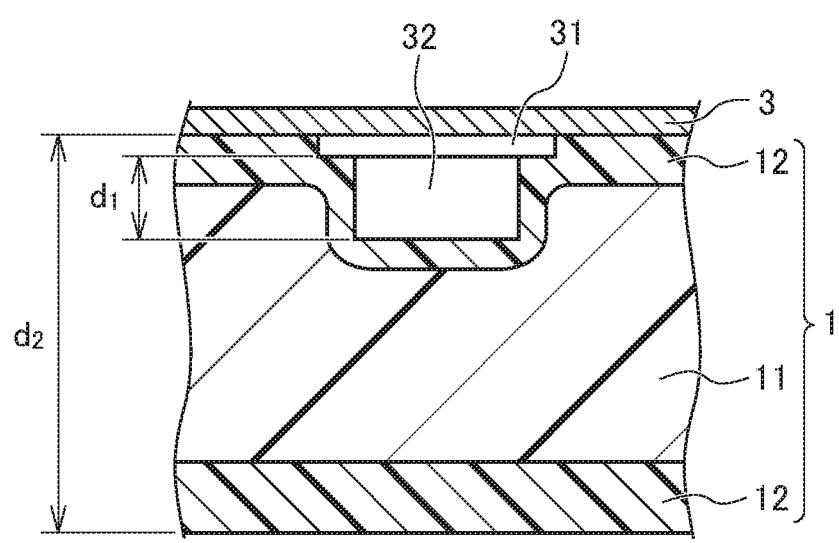
FIG. 4 is a partially enlarged view of FIG. 3 and is a view for description of molding characteristics of the sealing material sheet of the present invention in the case of being used in a thin film solar-cell module.

Herein, in the solar-cell module 10A, as illustrated in FIG. 4, there are irregularities due to a metal electrode 31 or a lead wire 32 for power collection on the surface at the non-light receiving surface side of the solar cell element 3. In the case of using a sealing material sheet that uses a polyethylene-based resin as a base resin in the related art, when heat resistance is intended to be secured by performing the crosslinking treatment or simply increasing a density, a problem arises in that voids V due to insufficiency of molding characteristics are formed (see FIG. 5).

However, in a case where the sealing material sheet 1 in which both the heat resistance and the molding characteristics are achieved at a high level is disposed on the irregularity surface, the sealing material sheet 1 also sufficiently wraps around the irregularities due to the metal electrode 31 or the lead wire 32 for power collection which are present on the surface of the non-light receiving surface side of the solar cell element 3 and can prevent the formation of the voids V (see FIG. 4). That is, in a case where there are irregularities formed by convex portions of the lead wire 32 or the like on the surface of the solar cell element like the solar-cell module 10A, the sealing material sheet 1 can be particularly preferably used. In a case where the thickness of the convex portions of the irregularities is 50% to 90% of the thickness of the sealing material sheet 1, the molding characteristics of the sealing material sheet are particularly exhibited. According to this, as described above, it is possible to sufficiently prevent the formation of the voids V due to existence of the irregularities on the surface of the solar cell element.

Figure 5:
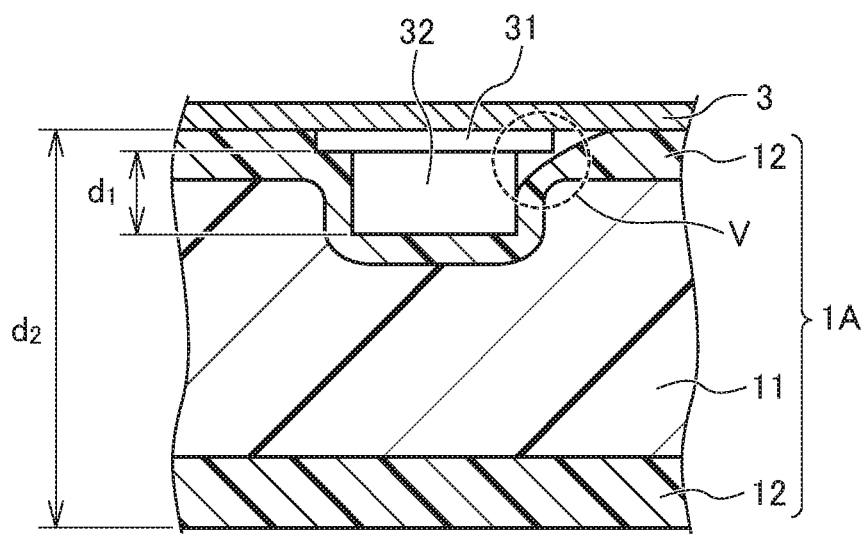
FIG. 5 is a partially enlarged cross-sectional view of a conventional solar-cell module using a conventional sealing material sheet inferior in molding characteristics as a thin film solar-cell module.

More specifically, in a case where the lead wire 32 is a lead wire having a thickness that is equal to or more than about a thickness ($d_1$) of 250 µm, the sealing material sheet 1 exhibits a particular effect that is significantly different from a conventional product. For example, as illustrated in FIG. 5, when the sealing material sheet 1 formed from a conventionally general polyethylene resin is disposed on the irregularity surface in a case where the thick lead wire 32 is disposed, in general, in a case where the thickness ($d_1$) of the lead wire 32 with respect to a thickness ($d_2$) of the sealing material sheet 1 exceeds 50% as a rough standard, the formation of the voids V described above becomes problematic in many cases. However, as illustrated in FIG. 4, in a case where the sealing material sheet 1 is disposed on such a irregularity surface, when the thickness ($d_1$) of the lead wire 32 with respect to the thickness ($d_2$) of the sealing material sheet 1 is 90% or less, it is possible to sufficiently prevent the formation of the voids V described above. Incidentally, in the present invention, in a case where a plurality of lead wires are laminated, for example, a case where lead wires are alternately disposed, the total thickness of the plurality of lead wires in a part at which the plurality of lead wires are laminated is considered as "the thickness of the lead wire" as described above, that is, "the thickness of the convex portion."

Method for Manufacturing Solar-Cell Module

The solar-cell module 10 can be manufactured by sequentially laminating the solar-cell module members constituted of the transparent front substrate 2, the sealing material 1A of the light receiving surface side, the solar cell element 3, the sealing material 1B of the non-light receiving surface side, the rear-surface protecting substrate 4, and the like, integrating the laminated members by a vacuum aspiration or the like, and then, thermocompression-molding the above members in one molding body by a molding method such as a laminating method.

EXAMPLES

Hereinafter, the present invention will be described in more detail with reference to Examples, but the present invention is not limited to the following Examples.

Manufacturing of Sealing Material Sheet for Solar-Cell Module

Sealing material composition raw materials described below were mixed at a ratio (parts by mass) in the following Table 1 to obtain sealing material compositions for a core layer and a sealing material composition for a skin layer of sealing material sheets of Examples and Comparative Examples. Each resin sheet for making respective sealing material compositions for a core layer and a skin layer was produced using a φ 30 mm extruder and a film molding machine having a T die having a width of 200 mm at an extrusion temperature of 210° C. and a pulling speed of 1.1 m/min. Further, these respective resin sheets were laminated to manufacture a sealing material sheet having a three-layer constitution of each of Examples and Comparative Examples that includes a core layer and a skin layer disposed on both outermost surfaces. The thicknesses of the respective sealing material sheets of Examples and Comparative Examples were all set to a total thickness of 450 μm. Regarding the thickness ratio of each layer of the sealing material sheet having a three-layer constitution of each of Examples and Comparative Examples, in all of the sealing material sheets, the thickness ratio of the skin layer:the core layer:the skin layer was set to 1:8:1 (the total thickness of the skin layers (total of two layers) being ¼ of the total thickness of the sealing material sheet). Incidentally, regarding Comparative Example 5, a single-layer sealing material sheet having a thickness of 450 μm was formed.

As a material resin of the sealing material composition for molding each resin sheet for a sealing material sheet, the following respective raw materials were used. Polyethylene-based resins 1 to 5 (respectively described as "PE1 to PE5" in Table)

all being metallocene-based linear low-density polyethylene-based resin (M-LLDPE). The density, the melting point, and the MFR at 190° C. were respectively as described in Table 1. Silane-modified polyethylene-based resin 1 (described as "PS1" in Table)

a silane-modified polyethylene-based resin obtained by mixing 2 parts by mass of vinyltrimethoxysilane and 0.15 part by mass of dicumyl peroxide as a radical generating agent (reaction catalyst) with respect to 100 parts by mass of metallocene-based linear low-density polyethylene-based resin having a density of 0.900 g/cm³ and an MFR of 2.0 g/10 min and melting and kneading the mixture at 200° C. Density of 0.900 g/cm³, MFR of 1.0 g/10 min. Melting point of 90° C. Silane-modified polyethylene-based resin 2 (described as "PS2" in Table)

a silane-modified polyethylene-based resin obtained by mixing 2 parts by mass of vinyltrimethoxysilane and 0.15 part by mass of dicumyl peroxide as a radical generating agent (reaction catalyst) with respect to 100 parts by mass of metallocene-based linear low-density polyethylene-based resin having a density of 0.880 g/cm³ and an MFR of 3.5 g/10 min and melting and kneading the mixture at 200° C. Density of 0.880 g/cm³, MFR of 2.0 g/10 min. Melting point of 60° C. Silane-modified polyethylene-based resin 3 (described as "PS3" in Table)

a silane-modified polyethylene-based resin obtained by mixing 2 parts by mass of vinyltrimethoxysilane and 0.15 part by mass of dicumyl peroxide as a radical generating agent (reaction catalyst) with respect to 100 parts by mass of metallocene-based linear low-density polyethylene-based resin having a density of 0.880 g/cm³ and an MFR of 30.0 g/10 min and melting and kneading the mixture at 200° C. Density of 0.885 g/cm³, MFR of 13.0 g/10 min. Melting point of 58° C.

2 parts by mass of vinyltrimethoxysilane and 0.15 part by mass of dicumyl peroxide as a radical generating agent (reaction catalyst) with respect to 100 parts by mass of the base resin were mixed and melted and kneaded at 200° C. to obtain a silane-modified polyethylene-based resin having a density of 0.885 g/cm³ and an MFR of 13 g/10 min. Melting point of 58° C.

Weight Average Molecular Weight of Skin Layer

The weight average molecular weight of the silane-modified polyethylene-based resin contained in each skin layer of Examples 1 and 2 and Comparative Example 1 was measured by a measurement method using the aforementioned GPC method. The results are presented in Table 2.

TABLE 1

| | | Polyethylene | | | | | Silane-modified polyethylene | | |
|---|---|---|---|---|---|---|---|---|---|
| | | PE1 | PE2 | PE3 | PE4 | PE5 | PS1 | PS2 | PS3 |
| | | Density (g/cm³) | | | | | | | |
| | | 0.880 | 0.898 | 0.898 | 0.905 | 0.919 | 0.900 | 0.880 | 0.885 |
| | | MFR (g/10 min.) | | | | | | | |
| | | 3.5 | 3.5 | 3.5 | 3.5 | 3.5 | 10 | 20 | 13.0 |
| | | Melting point (° C.) | | | | | | | |
| | | 60 | 90 | 90 | 97 | 105 | 90 | 60 | 58 |
| Example1 | Core layer | 65 | 5 | — | 32 | — | 3 | — | — |
| | Skin layer | 65 | 5 | — | 20 | — | 15 | — | — |
| Example2 | Core layer | 65 | 5 | 32 | — | — | — | 3 | — |
| | Skin layer | 65 | 5 | 20 | — | — | — | 15 | — |
| Example3 | Core layer | — | 5 | — | — | 97 | 3 | — | — |
| | Skin layer | — | 5 | 85 | — | — | 15 | — | — |
| Comparative Example1 | Core layer | 65 | 5 | — | 32 | — | — | — | 3 |
| | Skin layer | 65 | 5 | — | 20 | — | — | — | 15 |
| Comparative Example2 | Core layer | — | 5 | — | — | 97 | 3 | — | — |
| | Skin layer | — | 5 | 85 | — | — | 15 | — | — |
| Comparative Example3 | Core layer | 97 | 5 | — | — | — | 3 | — | — |
| | Skin layer | 65 | 5 | — | 20 | — | 15 | — | — |
| Comparative Example4 | Single layer | — | 60 | — | — | — | — | — | 40 |

TABLE 2

| | Weight average molecular weight |
|---|---|
| Example1 | 91000 |
| Example2 | 76000 |
| Comparative Example1 | 48000 |

Evaluation Example 1: Molding Characteristics

A lead wire (diameter: 250 μm) was disposed on the surface of colorless strengthened glass having a flat surface, the lead wire was further covered, and a laminate obtained by laminating each sealing material sheet of Examples and Comparative Examples cut into a size of 150 mm×150 mm was subjected to a vacuum heating lamination treatment at a set temperature of 150° C. under a vacuum aspiration for 3 minutes and an atmospheric pressurization of 7 minutes, thereby obtaining a sample for solar-cell module evaluation of each of Examples and Comparative Examples. The resin temperature (achieving temperature) of the sealing material sheet in lamination during the heating treatment was 147° C. These samples for solar-cell module evaluation were visually observed, and molding characteristics were evaluated by the following evaluation criteria.

Evaluation Criteria

A: The sealing material sheet completely followed irregularities of the facing base material surface. Formation of voids was not observed.
B: Five or less of air bubbles within 2 mm² were observed.
C: A part of the sealing material sheet did not completely follow irregularities of the facing base material surface and lamination defect parts (voids) were partially formed in the vicinity of the lead wire.

The evaluation results are described as "Molding characteristics" in Table 3.

Evaluation Example 2: Heat Resistance Test

A heat-resistant creep test was performed as a heat resistance test. One sheet of the sealing material sheet of each of Examples and Comparative Examples cut into a size of 5 cm×7.5 cm was superimposed on the same glass plate as in Evaluation Example 1 described above, the same glass plate as in Evaluation Example 1 having a size of 5 cm×7.5 cm was superimposed from the above, a vacuum heating lamination treatment was performed under the same conditions as in Evaluation Example 1 to prepare samples for evaluation. Thereafter, large-sized glass was placed vertically and left at 90° C. for 12 hours, the moving distance (mm) of the glass plate having a size of 5 cm×7.5 cm after being left was measured, and the heat resistance was evaluated by the following evaluation criteria.

Evaluation Criteria

A: 0.0 mm
B: more than 0.0 mm and less than 1.0 mm
C: 1.0 mm or more

The evaluation results are described as "Heat resistance" in Table 3.

Evaluation Example 3: Tensile Shear Adhesion Strength

The tensile shear adhesion strength as an index of adaptivity to the double-sided glass protecting substrate type module was measured. The measurement was performed by the test method according to JIS K 7197. Two sheets of the same glass plate as in Evaluation Example 1 described above were used, the sealing material sheets of Examples and Comparative Examples cut into a size of 2.5 cm×1.27 cm were placed between the two sheets of the glass plate and were adhered by performing a vacuum heating lamination treatment under the same conditions as in Evaluation Example 1 to prepare samples for evaluation. Thereafter, the tensile shear adhesion strength at a tensile rate of 1.27 mm/min was measured by the above-described test method, and the tensile shear adhesion strength was evaluated by the following evaluation criteria.

Evaluation Criteria

A: 1000 N or more
B: 500 N or more and less than 1000 N
C: less than 500 N

The evaluation results are described as "Tensile shear adhesion strength" in Table 3.

TABLE 3

| | Core layer | | | Skin layer | | | Average of whole layer | | |
|---|---|---|---|---|---|---|---|---|---|
| | Density (g/cm³) | MFR (g/10 min.) | Melting point (° C.) | Density (g/cm³) | MFR (g/10 min.) | Melting point (° C.) | Density (g/cm³) | MFR (g/10 min.) | Melting point (° C.) |
| Example1 | 0.889 | 3.4 | 74 | 0.888 | 3.1 | 73 | 0.889 | 3.4 | 73 |
| Example2 | 0.888 | 3.5 | 73 | 0.886 | 3.3 | 68 | 0.888 | 3.4 | 72 |
| Example3 | 0.917 | 3.4 | 104 | 0.898 | 3.1 | 90 | 0.912 | 3.4 | 100 |
| Comparative Example1 | 0.888 | 3.8 | 73 | 0.886 | 4.9 | 68 | 0.888 | 4.1 | 72 |
| Comparative Example2 | 0.917 | 3.4 | 104 | 0.904 | 3.1 | 96 | 0.914 | 3.4 | 102 |
| Comparative Example3 | 0.881 | 3.6 | 62 | 0.888 | 3.1 | 73 | 0.883 | 3.4 | 62 |
| Comparative Example4 | — | — | — | — | — | — | 0.891 | 7.3 | 78 |

TABLE 4

|  | Molding characteristics | Heat resistance | Tensile shear adhesion strength Strength(N) | Evaluation |
|---|---|---|---|---|
| Example1 | A | A | 1200 | A |
| Example2 | A | B | 1000 | A |
| Example3 | B | A | 2300 | A |
| Comparative Example1 | A | B | 450 | C |
| Comparative Example2 | C | A | 2000 | A |
| Comparative Example3 | A | C | 1000 | A |
| Comparative Example4 | A | A | 450 | C |

From Tables 1 to 4, it is found that the sealing material sheet of the present invention is a sealing material sheet using a polyethylene-based resin and is a sealing material sheet for a solar-cell module that has high productivity without performing crosslinking processing, and has a high tensile shear adhesion force at normal temperature at a high level in addition to heat resistance and molding characteristics.

What is claimed is:

1. A sealing material sheet for a solar-cell module, the sealing material sheet being a multi-layer sheet comprising:
   a core layer composed of a polyethylene-based resin as a base resin, and
   skin layers, which are laminated directly on both sides of the core layer and disposed on both outermost surfaces of the core layer and are composed of a polyethylene-based resin as a base resin,
   wherein:
   the multi-layer sheet has a total thickness of 250 μm or more and 600 μm or less,
   the core layer has a thickness of 200 μm or more and 400 μm or less and has a density that is in a range of from 0.880 g/cm$^3$ to 0.930 g/cm$^3$ and a melting point of 70° C. or higher;
   the skin layers have a thickness of 30 μm or more and 100 μm or less and have a density that is in a range of from 0.880 g/cm$^3$ to 0.910 g/cm$^3$ and a melting point of 90° C. or lower;
   the core layer and the skin layers contain a silane-modified polyethylene-based resin, a weight average molecular weight of the silane-modified polyethylene-based resin present in the core layer and the skin layers in terms of polystyrene is 70000 or more;
   a polymerized silane amount of the core layer with respect to a total amount of all resin components is in a range of from 30 ppm to 2000 ppm;
   a polymerized silane amount of the skin layers with respect to a total amount of all resin components is in a range of from 300 ppm to 2000 ppm;
   a melt mass flow rate of the sealing material sheet is 3.0 g/10 min or more and less than 3.8 g/10 min in terms of average of the whole layer;
   a tensile shear adhesion strength measured by a tensile shear adhesion strength measurement experiment is at least 1000 N; and
   the tensile shear adhesion strength measurement experiment measures the tensile shear adhesion strength by a test method according to JIS K7197 at a tensile rate of 1.27 mm/min, after preparing an evaluation sample using two colorless strengthened glass plates having a flat surface, placing a sealing material sheet cut to 2.5 cm×1.27 cm between the two glass plates, and performing a vacuum heating lamination treatment at a set temperature of 150° C. under a vacuum aspiration for 3 minutes and an atmospheric pressurization of 7 minutes.

2. The sealing material sheet according to claim 1, wherein the weight average molecular weight of the silane-modified polyethylene-based resin present in the skin layers in terms of polystyrene is in a range of from 90000 to 120000.

3. The sealing material sheet according to claim 1, wherein the melting points of the core layer and the skin layers are both in a range of from 70° C. to 80° C.

4. A solar-cell module obtained by sequentially laminating
   a transparent front substrate,
   a sealing material of a light receiving surface side,
   a solar cell element,
   a sealing material of a non-light receiving surface side, and
   a rear-surface protecting substrate,
   the sealing material of the light receiving surface side and the sealing material of the non-light receiving surface side being the sealing material sheet according to claim 1.

5. The solar-cell module according to claim 4, wherein both the transparent front substrate and the rear-surface protecting substrate are a protecting substrate made of glass.

6. The solar-cell module according to claim 5, wherein the solar-cell module is a frameless module having no protecting frame that surrounds a circumference of a side surface of a module laminate interposed between the protecting substrates made of glass to maintain a shape of the module laminate.

7. The solar-cell module according to claim 4, wherein,
   in a surface of the solar cell element, convex portions formed by a part of the surface protruding in a line-shaped manner or a dot-shaped manner exist, the convex portions being buried inside the sealing material sheet laminated on the surface, and
   a thickness of the convex portion is in a range of from 50% to 90% of a thickness of the sealing material sheet laminated on the surface of the solar cell element.

8. The sealing material sheet according to claim 1, wherein the sealing material sheet does not undergo crosslinking treatment.

9. The sealing material sheet according to claim 1, wherein the melting point of the skin layers is 80° C. or lower.

10. The sealing material sheet according to claim 1, wherein the melting point of the core layer is in a range of from 80° C. to 90° C.

11. The sealing material sheet according to claim 1, wherein a melt mass flow rate of the core layer is higher than a melt mass flow rate of the skin layers.

12. The sealing material sheet according to claim 1, wherein the density of the core layer is in a range of from 0.885 g/cm$^3$ to 0.895 g/cm$^3$.

13. The sealing material sheet according to claim 1, wherein the density of the skin layers is in a range of from 0.880 g/cm$^3$ to 0.899 g/cm$^3$.

14. The sealing material sheet according to claim 1, wherein the core layer and the skin layers both do not contain a crosslinking agent.

* * * * *